United States Patent
Shin et al.

(10) Patent No.: US 9,865,558 B2
(45) Date of Patent: Jan. 9, 2018

(54) SEMICONDUCTOR DEVICE CONNECTED BY ANISOTROPIC CONDUCTIVE FILM

(71) Applicant: SAMSUNG SDI CO., LTD., Yongin-si, Gyeonggi-do (KR)

(72) Inventors: Young Ju Shin, Suwon-si (KR); Kyoung Ku Kang, Suwon-si (KR); Ji Yeon Kim, Suwon-si (KR); Kyoung Soo Park, Suwon-si (KR); Young Woo Park, Suwon-si (KR); Byeong Geun Son, Suwon-si (KR); Kyoung Hun Shin, Suwon-si (KR); Kwang Jin Jung, Suwon-si (KR); Jae Sun Han, Suwon-si (KR); Ja Young Hwang, Suwon-si (KR)

(73) Assignee: SAMSUNG SDI CO., LTD., Yongin-Si, Gyeonggi-Do (KR)

( * ) Notice: Subject to any disclaimer, the term of this patent is extended or adjusted under 35 U.S.C. 154(b) by 183 days.

(21) Appl. No.: 14/712,674

(22) Filed: May 14, 2015

(65) Prior Publication Data

US 2016/0064349 A1    Mar. 3, 2016

(30) Foreign Application Priority Data

Sep. 1, 2014    (KR) .......................... 10-2014-0115436

(51) Int. Cl.
*H01B 1/20* (2006.01)
*H01L 23/00* (2006.01)
(Continued)

(52) U.S. Cl.
CPC ............ *H01L 24/29* (2013.01); *C08G 59/687* (2013.01); *C08G 59/72* (2013.01); *C09J 7/00* (2013.01);
(Continued)

(58) Field of Classification Search
CPC ...... C09J 7/00; C09J 9/02; C09J 163/00; C09J 2201/602; C09J 2201/622; C09J 2203/326;
(Continued)

(56) References Cited

U.S. PATENT DOCUMENTS 6,699,351 B2 * 3/2004 Yamaguchi .......... C08G 59/226
156/275.5
8,034,261 B2 * 10/2011 Kim .......................... C08J 5/18
252/511

(Continued)

FOREIGN PATENT DOCUMENTS

CN      103459453 A    12/2013
JP      2010-132614    6/2010
(Continued)

OTHER PUBLICATIONS

Taiwanese Office Action dated Dec. 16, 2015 in Corresponding Taiwanese Patent Application No. 104119198.

*Primary Examiner* — Mark Kopec
*Assistant Examiner* — Jaison P Thomas
(74) *Attorney, Agent, or Firm* — Lee & Morse, P.C.

(57) ABSTRACT

A semiconductor device connected by an anisotropic conductive film, the anisotropic conductive film having a differential scanning calorimeter onset temperature of 60° C. to 85° C., and a elastic modulus change of 30% or less, as calculated by Equation 1, below, Elastic modulus change(%)=$\{(M_1-M_0)/M_0\} \times 100$    [Equation 1]

wherein $M_0$ is an initial elastic modulus in kgf/cm$^2$ of the anisotropic conductive film as measured at 25° C., and $M_1$ is a elastic modulus in kgf/cm$^2$ of the anisotropic conductive film as measured at 25° C. after the film is left at 25° C. for 170 hours.

7 Claims, 1 Drawing Sheet

(51) Int. Cl.
*C09J 9/02* (2006.01)
*C09J 7/00* (2006.01)
*C08G 59/68* (2006.01)
*C08G 59/72* (2006.01)
*C08K 5/372* (2006.01)
*C08K 5/55* (2006.01)

(52) U.S. Cl.
CPC ............ *C09J 9/02* (2013.01); *H01B 1/20* (2013.01); *C08K 5/372* (2013.01); *C08K 5/55* (2013.01); *C09J 2201/602* (2013.01); *C09J 2201/622* (2013.01); *C09J 2203/326* (2013.01); *C09J 2205/102* (2013.01); *C09J 2463/00* (2013.01); *H01L 24/32* (2013.01); *H01L 2224/16238* (2013.01); *H01L 2224/2929* (2013.01); *H01L 2224/2939* (2013.01); *H01L 2224/29316* (2013.01); *H01L 2224/29339* (2013.01); *H01L 2224/29344* (2013.01); *H01L 2224/29347* (2013.01); *H01L 2224/29355* (2013.01); *H01L 2224/29411* (2013.01); *H01L 2224/29439* (2013.01); *H01L 2224/29444* (2013.01); *H01L 2224/29447* (2013.01); *H01L 2224/29455* (2013.01); *H01L 2224/32225* (2013.01)

(58) Field of Classification Search
CPC .... C09J 2463/00; H01L 23/488; H01L 24/29; H01L 2224/2919; H01L 2924/0002; H01L 2924/066; H01L 2924/0665; H05K 1/0306; H05K 1/0353; H05K 1/09; C08K 2201/001

See application file for complete search history.

(56) References Cited

U.S. PATENT DOCUMENTS

| | | | | |
|---|---|---|---|---|
| 8,043,709 | B2* | 10/2011 | Arifuku | C09J 9/02 156/273.9 |
| 2008/0054225 | A1* | 3/2008 | Watanabe | C08G 18/0823 252/500 |
| 2010/0193961 | A1* | 8/2010 | Konishi | C08L 63/00 257/773 |
| 2013/0126788 | A1* | 5/2013 | Park | H01B 1/12 252/500 |
| 2013/0154093 | A1* | 6/2013 | Yu | H01L 24/29 257/746 |
| 2013/0154129 | A1* | 6/2013 | Sul | C08G 59/226 257/788 |
| 2014/0159229 | A1* | 6/2014 | Shin | H01L 24/29 257/734 |

FOREIGN PATENT DOCUMENTS

| | | | | |
|---|---|---|---|---|
| JP | 2013-093315 | | 5/2013 | |
| JP | 2013093315 | * | 5/2013 | ............ H01B 1/22 |
| TW | 201331252 A1 | | 8/2013 | |

* cited by examiner

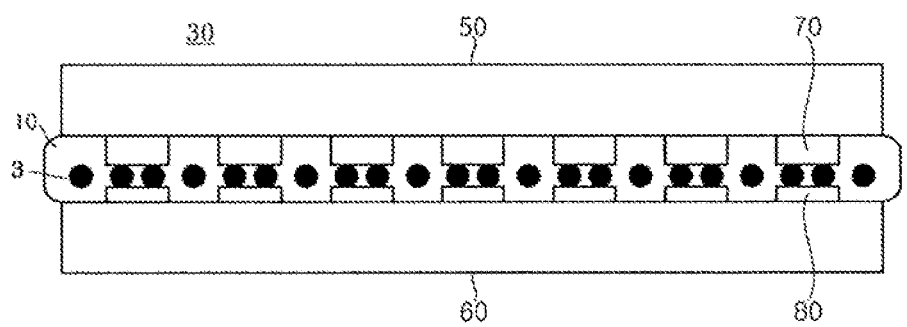

SEMICONDUCTOR DEVICE CONNECTED BY ANISOTROPIC CONDUCTIVE FILM

CROSS-REFERENCE TO RELATED APPLICATION

Korean Patent Application No. 10-2014-0115436, filed on Sep. 1, 2014, in the Korean Intellectual Property Office, and entitled: "Semiconductor Device Connected by Anisotropic Conductive Film," is incorporated by reference herein in its entirety.

BACKGROUND

1. Field

Embodiments relate to a semiconductor device connected by an anisotropic conductive film.

2. Description of the Related Art

With decreasing distances between connection terminals of components by production of small and highly functional electronic devices in recent years, various film-like adhesives capable of facilitating connection between such terminals may be used in bonding of an IC chip and a flexible printed circuit (FPC) board, bonding of an IC chip and a glass substrate including an indium tin oxide (ITO) electrode circuit formed thereon, and the like.

SUMMARY

Embodiments are directed to a semiconductor device connected by an anisotropic conductive film.

The embodiments may be realized by providing a semiconductor device connected by an anisotropic conductive film, the anisotropic conductive film having a differential scanning calorimeter onset temperature of 60° C. to 85° C., and an elastic modulus change of 30% or less, as calculated by Equation 1, below, $$\text{Elastic modulus change}(\%) = \{(M_1 - M_0)/M_0\} \times 100 \quad \text{[Equation 1]}$$

wherein $M_0$ is an initial elastic modulus in kgf/cm² of the anisotropic conductive film as measured at 25° C., and $M_1$ is an elastic modulus in kgf/cm² of the anisotropic conductive film as measured at 25° C. after the film is left at 25° C. for 170 hours. Specifically, the elastic modulus change is 1% or more to 30% or less.

The anisotropic conductive film may include an epoxy resin that includes a hydrogenated epoxy resin, a polymerization catalyst represented by Formula 1, below, and a compound represented by Formula 2, below,

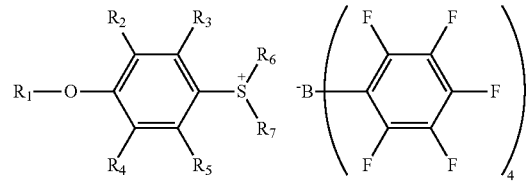

[Formula 1]

wherein, in Formula 1, $R_1$ to $R_5$ are each independently a hydrogen atom, an alkyl group, an acetyl group, an alkoxycarbonyl group, a benzoyl group, or a benzyloxycarbonyl group, and $R_6$ and $R_7$ are each independently an alkyl group, a benzyl group, an o-methylbenzyl group, an m-methylbenzyl group, a p-methylbenzyl group, or a naphthylmethyl group,

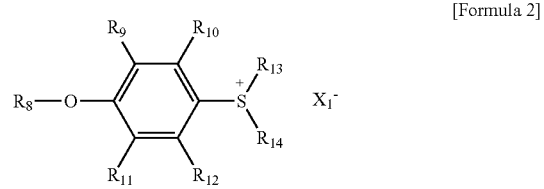

[Formula 2]

wherein, in Formula 2, $R_8$ to $R_{12}$ are each independently a hydrogen atom, an alkyl group, an acetyl group, an alkoxycarbonyl group, a benzoyl group, or a benzyloxycarbonyl group, $R_{13}$ and $R_{14}$ are each independently an alkyl group, a benzyl group, an o-methylbenzyl group, an m-methylbenzyl group, a p-methylbenzyl group, or a naphthylmethyl group, and $X_1$ is a halogen atom or an alkyl sulfuric acid.

$R_1$ to $R_5$ may each be a hydrogen atom, and $R_6$ and $R_7$ may each independently be an alkyl group, a benzyl group, an o-methylbenzyl group, an m-methylbenzyl group, a p-methylbenzyl group, or a naphthylmethyl group.

$R_8$ to $R_{12}$ may each be a hydrogen atom, $R_{13}$ and $R_{14}$ may each independently be an alkyl group, a benzyl group, an o-methylbenzyl group, an m-methylbenzyl group, a p-methylbenzyl group, or a naphthylmethyl group, and $X_1$ may be an alkyl sulfuric acid.

The hydrogenated epoxy resin may be present in an amount of 30 parts by weight to 60 parts by weight, based on 100 parts by weight of the epoxy resin.

The hydrogenated epoxy resin may include a hydrogenated bisphenol A epoxy monomer represented by Formula 3, below, or a hydrogenated bisphenol A epoxy oligomer represented by Formula 4, below,

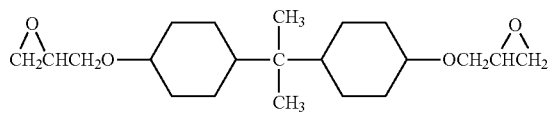

[Formula 3]

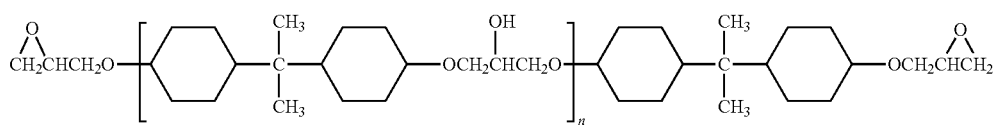

[Formula 4]

wherein, in Formula 4, n ranges from 0.1 to 13.

The anisotropic conductive film may further include a binder resin and conductive particles.

The anisotropic conductive film may include 20 wt % to 50 wt % of the epoxy resin, based on a total weight of a composition of the anisotropic conductive film in terms of solid content, the epoxy resin including 30 parts by weight to 60 parts by weight of the hydrogenated epoxy resin, based on 100 parts by weight of the epoxy resin, 5 parts by weight to 30 parts by weight of the polymerization catalyst, based on 100 parts by weight of the hydrogenated epoxy resin, 0.1 parts by weight to 30 parts by weight of the compound represented by Formula 2, based on 100 parts by weight of the polymerization catalyst, 25 wt % to 60 wt % of the binder resin, based on the total weight of a composition of the anisotropic conductive film in terms of solid content, and 1 wt % to 30 wt % of the conductive particles, based on the total weight of a composition of the anisotropic conductive film in terms of solid content.

The anisotropic conductive film may have an initial elastic modulus $M_0$ of 100 kgf/cm² to 1,200 kgf/cm².

The semiconductor device may include a first connection member having a first electrode, a second connection member having a second electrode, and the anisotropic conductive film between the first connection member and second connection member to connect the first and second electrodes.

One of the first connection member and second connection member may include an IC chip or a driver IC chip, and the other of the first connection member and second connection member may include a glass substrate.

The embodiments may be realized by providing a semiconductor device connected by an anisotropic conductive film, the anisotropic conductive film including an epoxy resin that includes a hydrogenated epoxy resin, a polymerization catalyst represented by Formula 1, below, and a compound represented by Formula 2, below,

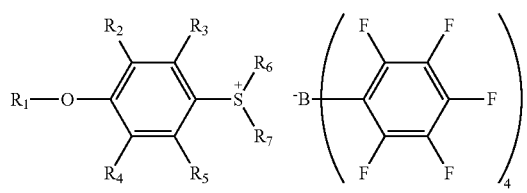

[Formula 1]

wherein, in Formula 1, $R_1$ to $R_5$ are each independently a hydrogen atom, an alkyl group, an acetyl group, an alkoxycarbonyl group, a benzoyl group, or a benzyloxycarbonyl group, and $R_6$ and $R_7$ are each independently an alkyl group, a benzyl group, an o-methylbenzyl group, an m-methylbenzyl group, a p-methylbenzyl group, or a naphthylmethyl group,

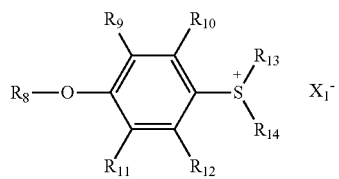

[Formula 2]

wherein, in Formula 2, $R_8$ to $R_{12}$ are each independently a hydrogen atom, an alkyl group, an acetyl group, an alkoxycarbonyl group, a benzoyl group, or a benzyloxycarbonyl group, $R_{13}$ and $R_{14}$ are each independently an alkyl group, a benzyl group, an o-methylbenzyl group, an m-methylbenzyl group, a p-methylbenzyl group, or a naphthylmethyl group, and $X_1$ is a halogen atom or an alkyl sulfuric acid

BRIEF DESCRIPTION OF THE DRAWING

Features will be apparent to those of skill in the art by describing in detail exemplary embodiments with reference to the attached drawing in which:

FIG. 1 illustrates a sectional view of a semiconductor device according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

One embodiment relates to a semiconductor device connected by a composition for anisotropic conductive films or an anisotropic conductive film, which includes: an epoxy resin that includes a hydrogenated epoxy resin; a cationic polymerization or curing catalyst (e.g., a cation-containing or cation-providing polymerization catalyst for cationic polymerization) represented by Formula 1; and a compound (e.g., stabilizer) represented by Formula 2. In an implementation, the composition for anisotropic conductive films or anisotropic conductive film may further include, e.g., a binder resin in addition to the components as set forth above.

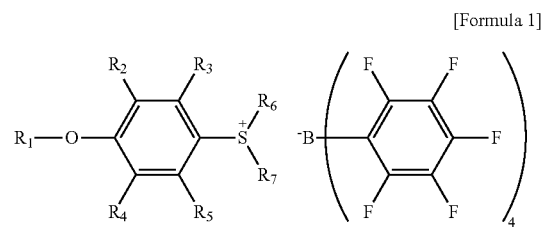

[Formula 1]

In Formula 1, $R_1$ to $R_5$ may each independently be or include, e.g., a hydrogen atom, an alkyl group, an acetyl group, an alkoxycarbonyl group, a benzoyl group, or a benzyloxycarbonyl group. $R_6$ and $R_7$ may each independently be or include, e.g., an alkyl group, a benzyl group, an o-methylbenzyl group, an m-methylbenzyl group, a p-methylbenzyl group, or a naphthylmethyl group.

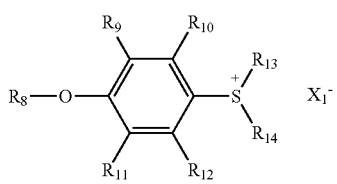

In Formula 2, $R_8$ to $R_{12}$ may each independently be or include, e.g., a hydrogen atom, an alkyl group, an acetyl group, an alkoxycarbonyl group, a benzoyl group, or a benzyloxycarbonyl group. $R_{13}$ and $R_{14}$ may each independently be or include, e.g., an alkyl group, a benzyl group, an o-methylbenzyl group, an m-methylbenzyl group, a p-methylbenzyl group, or a naphthylmethyl group. $X_1$ may be, e.g., a halogen atom or an alkyl sulfuric acid.

In an implementation, the hydrogenated epoxy resin may include, e.g., a hydrogenated bisphenol A epoxy resin and/or an alicyclic hydrogenated epoxy resin, such as a cycloaliphatic epoxy resin. The cycloaliphatic epoxy resin may be a resin having a particular structure, e.g., an alicyclic diepoxy acetal, an alicyclic diepoxy adipate, an alicyclic diepoxy carboxylate, a vinyl cyclohexene dioxide, or the like.

The hydrogenated bisphenol A epoxy resin may be obtained using, e.g., a hydrogenated bisphenol A derivative and epichlorohydrin, and may have a structure in which a double bond in a bisphenol A molecule is substituted with a hydrogen molecule or atom.

In an implementation, the hydrogenated bisphenol A epoxy resin may include, e.g., a hydrogenated bisphenol A epoxy monomer represented by Formula 3 or a hydrogenated bisphenol A epoxy oligomer represented by Formula 4.

increased connection resistance at an initial stage and after reliability evaluation due to deterioration in film properties thereof.

In an implementation, another epoxy resin, e.g., other than the hydrogenated epoxy resin, may be additionally used or included. The other epoxy resin may include at least one of, e.g., a bisphenol resin, a novolac resin, a glycidyl resin, an aliphatic epoxy resin, an alicyclic epoxy resin, and/or an aromatic epoxy resin.

In an implementation, the polymerization catalyst represented by Formula 1 may be used.

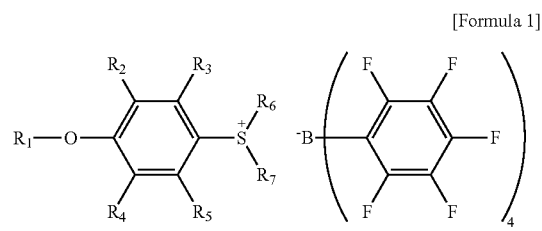

In Formula 1, $R_1$ to $R_5$ may each independently be or include, e.g., a hydrogen atom, an alkyl group, an acetyl group, an alkoxycarbonyl group, a benzoyl group, or a benzyloxycarbonyl group. $R_6$ and $R_7$ may each independently be or include, e.g., an alkyl group, a benzyl group, an o-methylbenzyl group, an m-methylbenzyl group, a p-methylbenzyl group, or a naphthylmethyl group. In an implementation, $R_1$ to $R_5$ may each independently be or include, e.g., a hydrogen atom or an alkyl group, and $R_6$ and $R_7$ may each independently be or include, e.g., an alkyl group, a benzyl group, an o-methylbenzyl group, an m-methylbenzyl group, a p-methylbenzyl group, or a naphthylmethyl group.

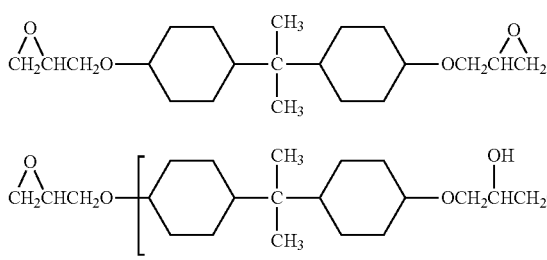

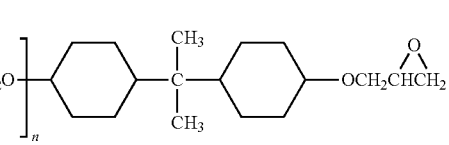

In Formula 4, n may range from, e.g., 0.1 to 13.

The hydrogenated epoxy resin may have an epoxy equivalent weight of, e.g., 150 g/eq to 1,200 g/eq, and/or a viscosity of, e.g., 900 cps/25° C. to 12,000 cps/25° C.

The hydrogenated epoxy resin may be present in an amount of 5% by weight (wt %) to 25 wt %, based on a total weight of the anisotropic conductive composition in terms of solid content. In an implementation, the hydrogenated epoxy resin may be present in an amount of 30 parts by weight to 60 parts by weight, e.g., 35 parts by weight to 55 parts by weight, based on 100 parts by weight of the epoxy resin. Within this range, the anisotropic conductive film may have advantages in terms of film properties, moisture resistance, heat resistance, and reliability. Maintaining the amount of the hydrogenated epoxy resin at 60 parts by weight or less, based on 100 parts by weight of the epoxy resin, may help ensure that the anisotropic conductive film does not exhibit In an implementation, $R_1$ to $R_5$ may each be, e.g., a hydrogen atom, and $R_6$ and $R_7$ may each independently be or include, e.g., an alkyl group, a benzyl group, an o-methylbenzyl group, an m-methylbenzyl group, a p-methylbenzyl group, or a naphthylmethyl group.

The polymerization catalyst represented by Formula 1 may help reduce and/or prevent emission of large amounts of fluorine ions upon cationic polymerization, and thus may help reduce and/or prevent corrosion of metal wires, connection pads, and the like. In an implementation, the cationic polymerization catalyst represented by Formula 1 may generate cations at lower temperatures, and thus may facilitate rapid curing of the anisotropic conductive film at a low temperature of e.g., 150° C. or less, 140° C. or less, or 130° C. or less.

The polymerization catalyst represented by Formula 1 may be present in an amount of, e.g., 5 parts by weight to 30 parts by weight or 10 parts by weight to 25 parts by weight, based on 100 parts by weight of the hydrogenated epoxy resin. Within this range, the anisotropic conductive film may have advantages in terms of storage stability and low-temperature rapid curing.

In an implementation, the compound represented by Formula 2 may be used, e.g., as a stabilizer.

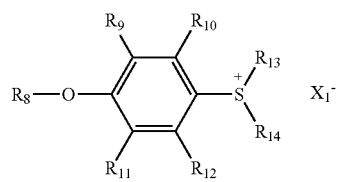

[Formula 2]

In Formula 2, $R_8$ to $R_{12}$ may each independently be or include, e.g., a hydrogen atom, an alkyl group, an acetyl group, an alkoxycarbonyl group, a benzoyl group, or a benzyloxycarbonyl group. $R_{13}$ and $R_{14}$ may each independently be or include, e.g., an alkyl group, a benzyl group, an o-methylbenzyl group, a m-methylbenzyl group, a p-methylbenzyl group, or a naphthylmethyl group. $X_1$ may be, e.g., a halogen atom or an alkyl sulfuric acid.

In an implementation, $R_8$ to $R_{12}$ may each independently be or include, e.g., a hydrogen atom or an alkyl group, and $R_{13}$ and $R_{14}$ may each independently be or include, e.g., an alkyl group, a benzyl group, an o-methylbenzyl group, an m-methylbenzyl group, a p-methylbenzyl group, or a naphthylmethyl group. In an implementation, $R_8$ to $R_{12}$ may each be, e.g., a hydrogen atom, $R_{13}$ and $R_{14}$ may each independently be or include, e.g., an alkyl group, a benzyl group, an o-methylbenzyl group, an m-methylbenzyl group, a p-methylbenzyl group, or a naphthylmethyl group, and $X_1$ may be, e.g., an alkyl sulfuric acid.

The anisotropic conductive film may be cured even at room or ambient temperature due to cations generated from the polymerization catalyst represented by Formula 1, and thus could exhibit deterioration in storage stability. However, the compound represented by Formula 2 may help suppress curing of the anisotropic conductive film at ambient temperature by capturing the cations generated from the polymerization catalyst represented by Formula 1, and thus may help improve storage stability of the anisotropic conductive film.

The compound represented by Formula 2 may be present in an amount of, e.g., 0.1 parts by weight to 30 parts by weight or 3 parts by weight to 10 parts by weight, based on 100 parts by weight of the polymerization catalyst represented by Formula 1. Within this range, the anisotropic conductive film may exhibit improved storage stability without inhibition of low-temperature rapid curing thereof.

A semiconductor device may be connected by the anisotropic conductive composition or the anisotropic conductive film according to the embodiment, which may include the polymerization catalyst represented by Formula 1 and the compound represented by Formula 2, and thus may be cured at low temperature and may exhibit improved storage stability and connection reliability.

In an implementation, the composition for anisotropic conductive films or anisotropic conductive film may further include, e.g., the binder resin, in addition to the components as set forth above. Examples of the binder resin may include a polyimide resin, a polyamide resin, a phenoxy resin, an epoxy resin, a polymethacrylate resin, a polyacrylate resin, a polyurethane resin, an acrylate modified urethane resin, a polyester resin, a polyester urethane resin, a polyvinyl butyral resin, a styrene-butylene-styrene (SBS) resin and epoxylated modifications thereof, a styrene-ethylene-butylene-styrene (SEBS) resin and modifications thereof, an acrylonitrile butadiene rubber (NBR) or hydrogenated compounds thereof, and the like. These may be used alone or in combination thereof. A higher weight average molecular weight of the binder resin may facilitate film formation. In an implementation, the binder resin may have a weight average molecular weight of, e.g., 5,000 g/mol to 150,000 g/mol or 10,000 g/mol to 80,000 g/mol. Maintaining the weight average molecular weight of the binder resin at 5,000 g/mol or greater may help ensure that film formation is not inhibited. Maintaining the weight average molecular weight of the binder resin at 150,000 g/mol or less may help ensure good compatibility with other components. The binder resin may be present in an amount of, e.g., 25 parts by weight to 60 parts by weight or 30 parts by weight to 50 parts by weight, based on 100 parts by weight of the composition for anisotropic conductive films. In an implementation, the binder resin may be included in an amount of, e.g., 25 wt % to 60 wt %, based on the total weight of the composition of the anisotropic conductive film in terms of solid content.

In an implementation, the composition for anisotropic conductive films or anisotropic conductive film may further include, e.g., conductive particles, in addition to the components as set forth above. For example, the conductive particles may include: metal particles including Au, Ag, Ni, Cu and Pb; carbon particles; particles obtained by coating a polymer resin with a metal; particles obtained through insulation treatment of a surface of particles obtained by coating a polymer resin with a metal, or the like. The polymer resin may include, e.g., polyethylene, polypropylene, polyester, polystyrene, or polyvinyl alcohol. The metal for coating of the polymer resin may include, e.g., Au, Ag, Ni, Cu, and Pb.

For example, in the case of outer lead bonding (OLB), an adherend may be an indium tin oxide (ITO) glass surface, and conductive particles including a core made of a plastic component may be used to prevent damage to the ITO by pressure generated in a connection process of the anisotropic conductive film. In the case of connection of PCB substrates, metal particles such as Ni particles may be used. In the case of plasma display panels (PDPs), conductive particles obtained by plating metal particles such as Ni particles with gold (Au) may be used due to extremely high voltage applied to a circuit. In the case of chip on glass (COG) or narrow-pitch chip on film (COF), insulated conductive particles obtained by covering a surface of conductive particles with a thermoplastic resin may be used. In an implementation, the composition for anisotropic conductive films or the anisotropic conductive film according to an embodiment may be suitable for COG bonding.

A size of the conductive particles may be selected depending upon pitches of applied circuits and purposes. In an implementation, the conductive particles may have a particle size of, e.g., 1 μm to 30 μm or 3 μm to 20 μm. The conductive particles may be present in an amount of, e.g., 1 wt % to 30 wt % or 1 wt % to 15 wt %, based on the total weight of the composition for anisotropic conductive films in terms of solid content. Within this range, the anisotropic conductive film may secure stable connection reliability, and may help prevent an electrical short-circuit caused by agglomeration of the conductive particles between the pitches upon thermal compression.

In an implementation, the composition for anisotropic conductive films or an anisotropic conductive film may further include, e.g., a silane coupling agent, in addition to the components as set forth above.

The silane coupling agent may include, e.g., a polymerizable fluorine group-containing silicon compound, such as vinyltrimethoxysilane, vinyltriethoxysilane, and (meth)acryloxypropyltrimethoxysilane; an epoxylated silicon compound, such as 3-glycidoxypropyltrimethoxysilane, 3-glycidoxypropylmethyldimethoxysilane, and 2-(3,4-epoxycyclohexyl)ethyltrimethoxysilane; an amino group-containing silicon compound, such as 3-aminopropyltrimethoxysilane, N-(2-aminoethyl)-3-aminopropyltrimethoxysilane, and N-(2-aminoethyl)-3-aminopropylmethyldimethoxysilane; or 3-chloropropyltrimethoxysilane.

The silane coupling agent may be present in an amount of, e.g., 1 wt % to 10 wt %, based on the total weight of the composition for anisotropic conductive films in terms of solid content.

In an implementation, the anisotropic conductive film may further include an additive, e.g., a polymerization inhibitor, an antioxidant, and/or a heat stabilizer, to exhibit additional properties without deterioration in fundamental properties thereof. The additive may be present in an amount of, e.g., 0.01 wt % to 10 wt % in the composition for anisotropic conductive films in terms of solid content.

Examples of the polymerization inhibitor may include hydroquinone, hydroquinone monomethyl ether, p-benzoquinone, phenothiazine, and mixtures thereof. The antioxidant may include, e.g., a phenolic compound, a hydroxycinnamate compound, or the like. Examples of the antioxidant may include tetrakis-(methylene-(3,5-di-t-butyl-4-hydroxycinnamate)methane, 3,5-bis(1,1-dimethylethyl)-4-hydroxybenzenepropanoic acid thiodi-2,1-ethanediyl ester, and the like.

In an implementation, the anisotropic conductive film may include an anisotropic conductive adhesive layer (which is formed of or from the composition for anisotropic conductive films) and a release film. The release film may be removed upon preliminary compression of the anisotropic conductive film to a first or second connection member. Therefore, the anisotropic conductive film and the anisotropic conductive adhesive layer may be compatibly used herein.

In an implementation, the anisotropic conductive film may have, e.g., a single-layer structure including one anisotropic conductive adhesive layer; a two-layer structure in which a non-conductive adhesive layer not containing conductive particles and a conductive adhesive layer containing conductive particles are stacked in order; or a three-layer structure in which a non-conductive adhesive layer is stacked on both surfaces of a conductive adhesive layer. The composition for anisotropic conductive films disclosed herein may be used for the non-conductive adhesive layer, the conductive adhesive layer, or both the non-conductive and conductive adhesive layers.

The embodiments may provide a semiconductor device connected by an anisotropic conductive film which has an elastic modulus change of 30% or less (as represented by Equation 1, below, e.g., after storage at 25° C. for 170 hours), and/or a differential scanning calorimeter (DSC) onset temperature of 60° C. to 85° C.

$$\text{Elastic modulus change}(\%) = \{(M_1 - M_0)/M_0\} \times 100 \qquad \text{[Equation 1]}$$

In Equation 1, $M_0$ is an initial elastic modulus in kgf/cm² of the anisotropic conductive film as measured at 25° C., and $M_1$ is an elastic modulus in kgf/cm² of the anisotropic conductive film as measured at 25° C. after the film is left at 25° C. for 170 hours.

The elastic modulus change of 30% or less may be associated with or may be representative of an improvement in storage stability of the anisotropic conductive film. The DSC onset temperature of 60° C. to 85° C. may be associated with or may be representative of low-temperature rapid curing properties thereof. As used herein, the DSC onset temperature refers to temperature at a point of time at which a slope of the DSC graph is increased for the first time due to exothermic reaction upon measurement of heat quantity from the anisotropic conductive film along with temperature change using DSC. In an implementation, the anisotropic conductive film may have an initial elastic modulus $M_0$ of, e.g., 100 kgf/cm² to 1,200 kgf/cm² or 250 kgf/cm² to 750 kgf/cm². Within this range of initial elastic modulus, the anisotropic conductive film may exhibit improved film properties.

In an implementation, the anisotropic conductive film may include the epoxy resin including the hydrogenated epoxy resin, the polymerization catalyst represented by Formula 1, and the compound represented by Formula 2, as described above. In an implementation, the anisotropic conductive film may further include the binder resin and/or the conductive particles. In an implementation, amounts and types of the hydrogenated epoxy resin, the polymerization catalyst represented by Formula 1, and the compound represented by Formula 2 described above may also be applied to these embodiments.

In an implementation, the anisotropic conductive film may have a connection resistance increase ratio of 10 to 60, as represented or calculated by Equation 2, below.

$$\text{Connection resistance increase ratio} = T_1/T_0 \qquad \text{[Equation 2]}$$

In Equation 2, $T_0$ is a connection resistance as measured after the anisotropic conductive film is subjected to compression at 150° C. and 70 MPa for 5 seconds, and $T_1$ is a connection resistance as measured after the anisotropic conductive film is left at 85° C. and 85% RH for 500 hours.

The embodiments may provide a semiconductor device that includes, e.g., a first connection member having a first electrode; a second connection member having a second electrode; and the anisotropic conductive film between the first and second connection members to connect the first and second electrodes.

Each of the first and second connection members may include an electrode for an electrical connection. For example, the first and second connection members may include glass substrates, plastic substrates, printed circuit boards, ceramic circuit boards, flexible circuit boards, semiconductor silicon chips, IC chips, driver IC chips, or the like, on which an electrode, such as indium tin oxide (ITO) electrode or an indium zinc oxide (IZO) electrode, is formed. In an implementation, one of the first and second connection members may be an IC chip or a driver IC chip, and the other may be a glass substrate.

Referring to FIG. 1, in a semiconductor device 30, a first connection member 50 (having a first electrode 70) and a second connection member 60 (having a second electrode 80) may be bonded to each other via the anisotropic conductive layer 10 (including conductive particles 3) between the first connecting member 50 and the second connecting member 60 and may connect the first electrode 70 to the second electrode 80.

The embodiments may provide an anisotropic conductive film formed of or prepared from the anisotropic conductive film composition. No special apparatus or equipment is required to form the anisotropic conductive film. For example, the anisotropic conductive film, which includes an anisotropic conductive adhesive layer and a release film, may be obtained by dissolving the anisotropic conductive composition according to an embodiment in an organic solvent such as toluene, stirring the obtained solution at a speed selected with a view toward preventing pulverization of conductive particles for a predetermined period of time, coating the solution to a certain thickness, for example, a thickness from 10 μm to 50 μm, onto the release film, and drying the solution for a predetermined period of time to evaporate toluene and the like.

The release film may include, e.g., a polyolefin film, such as polyethylene, polypropylene, ethylene/propylene copolymer, polybutene-1, ethylene/vinyl acetate copolymer, mixtures of polyethylene/styrene butadiene rubber, polyvinyl chloride, and the like. In an implementation, the release film may include: a polymer such as polyethylene terephthalate, polycarbonate, poly(methylmethacrylate), or the like; a thermoplastic elastomer, such as polyurethane, polyamide-polyol copolymers, or the like; and mixtures thereof. The release film may have any suitable thickness. For example, the release film may have a thickness of 10 μm to 50 μm.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE 1

Manufacture of Anisotropic Conductive Film 35 wt % of a binder (YP50, Kukdo Chemical Co., Ltd.), 20 wt % of a hydrogenated epoxy resin (ST-3000, Kukdo Chemical Co., Ltd.), 20.8 wt % of a propylene oxide-based epoxy resin (EP-4000S, Adeka Co., Ltd.), 4 wt % of a curing catalyst (SI-B3A, Sanshin Chemical Co., Ltd.), 0.2 wt % of a stabilizer (SI-S, Sanshin Chemical Co., Ltd.), 20 wt % of conductive particles (AUL704F, Sekisui Co., Ltd.), and propylene glycol monomethyl ether acetate (PGMEA) as a solvent were mixed. The obtained mixed liquid was coated onto a release film, followed by drying in a dryer at 60° C. to volatilize the solvent, thereby obtaining an anisotropic conductive film (thickness of coating layer: 10 μm).

EXAMPLE 2

Manufacture of Anisotropic Conductive Film

An anisotropic conductive film was manufactured in the same manner as in Example 1 except that SI-B2A (Sanshin Chemical Co., Ltd.) was used as the curing catalyst instead of SI-B3A.

EXAMPLE 3

Manufacture of Anisotropic Conductive Film

An anisotropic conductive film was manufactured in the same manner as in Example 1 except that S-ME (Sanshin Chemical Co., Ltd.) was used as the stabilizer instead of SI-S.

COMPARATIVE EXAMPLE 1

Manufacture of Anisotropic Conductive Film

An anisotropic conductive film was manufactured in the same manner as in Example 1 except that a glycidyl amine-type epoxy resin (SE-300P, SHINA T&C Co., Ltd.) was used instead of the hydrogenated epoxy resin of ST-3000.

COMPARATIVE EXAMPLE 2

Manufacture of Anisotropic Conductive Film

An anisotropic conductive film was manufactured in the same manner as in Example 1 except that the stabilizer was not included and the curing catalyst was included in an amount of 4.2 wt %.

COMPARATIVE EXAMPLE 3

Manufacture of Anisotropic Conductive Film

An anisotropic conductive film was manufactured in the same manner as in Example 1 except that methylenebis (aniline) (MDA-220, Kukdo Chemical Co., Ltd.) was used as the stabilizer instead of SI-S.

EXPERIMENTAL EXAMPLE

Property Evaluation of Anisotropic Conductive Film

Each of the anisotropic conductive films manufactured in Examples 1 to 3 and Comparative Examples 1 to 3 was evaluated using the following methods as to DSC onset temperature, elastic modulus change after 170 hours at 25° C., connection resistance, and connection resistance after reliability evaluation. Results are shown in Table 1, below.

DSC Onset Temperature

DSC onset temperature was defined as temperature at a time point at which the slope of the DSC graph was increased for the first time due to heat generation upon measurement of heat quantity from an adhesive layer of an anisotropic conductive film using a differential scanning calorimeter Model Q20 (TA Instruments) at a rate of 10° C./min in a temperature range from 0° C. to 300° C. under a nitrogen atmosphere.

Elastic modulus change after 170 hours at 25° C.

Initial elastic modulus at 25° C. ($M_0$) of an adhesive layer of the anisotropic conductive film having a size of 2 mm×10 mm×10 μm (width×length×thickness) was measured by pulling in 180° direction at both end-side at a speed of 5 mm/min at ambient temperature (25° C.) using a UTM apparatus. Here, measurement was performed using a 100 N UTM jig and the initial elastic modulus was calculated from a slope at the point of a half of a maximum stress, i.e., (the half stress value of the maximum stress −initial stress value)/(a stain value at the point of the half of maximum stress) Next, elastic modulus at 25° C. ($M_1$) was measured with the same manner above after the film was left for 170 hours at 25° C. Then, elastic modulus change after 170 hours with respect to the initial elastic modulus was calculated (using Equation 1) as a percentage.

Connection Resistance and Connection Resistance after Reliability Evaluation

To evaluate connection resistance of an anisotropic conductive film, a glass substrate including an indium tin oxide (ITO) circuit having a bump area of 1,200 μm² and a thickness of 2,000 Å, and an IC chip having a bump area of 1,200 μm² and a thickness of 1.5 mm were placed on upper and lower surfaces of the anisotropic conductive film, followed by compression and heating under conditions of 150° C. and 70 Mpa for 5 seconds, thereby manufacturing 5 specimens per sample. Initial connection resistance ($T_0$) of each of the specimens was measured.

In addition, for reliability evaluation, the circuit connection product was left in a high-temperature high-humidity chamber at 85° C. and 85% RH for 500 hours, followed by measurement of connection resistance after reliability evaluation ($T_1$) in the same manner as described above.

Connection resistance was measured by a 4-point probe method using a resistance tester Model 2000 multimeter (Keithley Co., Ltd.), in which resistance between four points was measured using four probes connected to the tester (ASTM F43-64T). Voltage measured by applying a test current of 1 mA was used to calculate resistance, which in turn was displayed on the tester.

TABLE 1

|  | Example 1 | Example 2 | Example 3 | Comparative Example 1 | Comparative Example 2 | Comparative Example 3 |
|---|---|---|---|---|---|---|
| DSC onset temperature (° C.) | 75 | 67 | 72 | 88 | 80 | 92 |
| Initial elastic modulus (kgf/cm²) | 460 | 650 | 380 | 1020 | 480 | 530 |
| Elastic modulus change (%) | 12 | 15 | 20 | 8 | 80 | 10 |
| Connection resistance (Ω) | 0.1 | 0.1 | 0.1 | 2.3 | X | 10 |
| Reliability connection resistance (Ω) | 1.8 | 2.3 | 2.8 | X | X | X |

(X Represents Connection Failure)

As shown in Table 1, the anisotropic conductive films of Examples 1 to 3 had a DSC onset temperature of 60° C. to 85° C. and thus facilitated curing at low temperature. In addition, the anisotropic conductive films of Examples 1 to 3 exhibited excellent connection resistance at an initial stage and after reliability evaluation when subjected to preliminary and primary compression under conditions of low-temperature rapid curing, and exhibited excellent storage stability since curing reaction did not occur as evidenced by an elastic modulus change of less than 30% after 170 hours at 25° C. On the other hand, the anisotropic conductive film of Comparative Example 1, which did not include the hydrogenated epoxy resin, failed connection after reliability evaluation upon preliminary and primary compression under conditions of low-temperature rapid curing. In addition, the anisotropic conductive film of Comparative Example 2, which did not contain the stabilizer, exhibited deteriorated storage stability. In addition, for the anisotropic conductive film of Comparative Example 3, it may be considered that polymerization of the epoxy resin due to Lewis acid generated from the cationic polymerization catalyst was delayed due to reaction of a compound having an unshared electron pair, such as N and O, with the polymerization catalyst. Thus, the anisotropic conductive film of Comparative Example 3 exhibited poor connection resistance at an initial stage and connection failure after reliability evaluation upon low-temperature bonding.

By way of summation and review, in an anisotropic conductive film (ACF), which is one film-like adhesive and that contains conductive particles in a resin composition, a resin may be fluidized by heating and compression to seal a gap between electrodes facing each other on connection targets. In addition, a space between the electrodes may be filled with some of the conductive particles, thereby allowing electric connection between the electrodes. Cationic polymerizable epoxy adhesives may be used in mounting or attaching wires and LCD panels to a substrate in electronic products. For example, a cationic catalyst for application to ACFs may have a curing temperature of 200° C. or less and a storage stability of 24 hours or more.

A sulfonium borate catalyst may be a cationic or cation-providing catalyst for epoxy curing. This catalyst may have a low storage stability of 1 hour or less in an epoxy solution, and thus an improvement in storage stability may be required. In addition, although a stabilizer may be added to help improve storage stability, the stabilizer may not provide a dense structure to the anisotropic conductive film after curing. The embodiments provide an anisotropic conductive film that exhibits higher moisture resistance and heat resistance while exhibiting improved connection reliability and film properties.

The embodiments may provide an anisotropic conductive film that exhibits improved properties in terms of storage stability, moisture resistance, heat resistance, and film formability while securing low-temperature rapid curing by heat curing.

The embodiments may provide an anisotropic conductive film that facilitates a connection even at a connection temperature of 150° C. or less and that exhibits excellent stability, adhesion, and reliability.

According to the embodiments, the anisotropic conductive film may exhibit improved properties in terms of storage stability, moisture resistance, heat resistance and film properties while securing low-temperature rapid curing, thereby providing advantages of excellent adhesion and connection reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device connected by an anisotropic conductive film, the anisotropic conductive film having:
    a differential scanning calorimeter onset temperature of 60° C. to 85° C., and an elastic modulus change of 30% or less, as calculated by Equation 1, below, Elastic modulus change (%)=$\{(M_1-M_0)/M_0\}\times 100$ [Equation 1]

wherein:
$M_0$ is an initial elastic modulus in kgf/cm$^2$ of the anisotropic conductive film as measured at 25° C., and
$M_1$ is an elastic modulus in kgf/cm$^2$ of the anisotropic conductive film as measured at 25° C. after the film is left at 25° C. for 170 hours,
wherein the anisotropic conductive film includes:
20 wt % to 50 wt % of an epoxy resin that includes a hydrogenated epoxy resin, based on a total weight of a composition of the anisotropic conductive film in terms of solid content, the epoxy resin including 30 parts by weight to 60 parts by weight of the hydrogenated epoxy resin, based on 100 parts by weight of the epoxy resin,
5 parts by weight to 30 parts by weight of a polymerization catalyst represented by Formula 1, below, based on 100 parts by weight of the hydrogenated epoxy resin,
0.1 parts by weight to 30 parts by weight of a compound represented by Formula 2, below, based on 100 parts by weight of the polymerization catalyst,
25 wt % to 60 wt % of a binder resin, based on the total weight of a composition of the anisotropic conductive film in terms of solid content and
1 wt % to 30 wt % of conductive particles, based on the total weight of a composition of the anisotropic conductive film in terms of solid content,

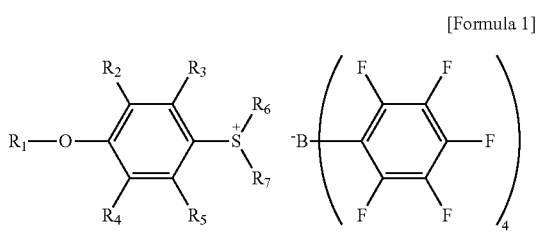

[Formula 1]

wherein, in Formula 1, $R_1$ to $R_5$ are each independently a hydrogen atom, an alkyl group, an acetyl group, an alkoxycarbonyl group, a benzoyl group, or a benzyloxycarbonyl group, and
$R_6$ and $R_7$ are each independently an alkyl group, a benzyl group, an o-methylbenzyl group, an m-methylbenzyl group, a p-methylbenzyl group, or a naphthylmethyl group,

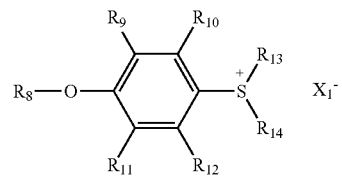

[Formula 2]

wherein, in Formula 2, $R_8$ to $R_{12}$ are each independently a hydrogen atom, an alkyl group, an acetyl group, an alkoxycarbonyl group, a benzoyl group, or a benzyloxycarbonyl group,
$R_{13}$ and $R_{14}$ are each independently an alkyl group, a benzyl group, an o-methylbenzyl group, an m-methylbenzyl group, a p-methylbenzyl group, or a naphthylmethyl group, and
$X_1$ is a halogen atom or an alkyl sulfuric acid.

2. The semiconductor device as claimed in claim 1, wherein:
$R_1$ to $R_5$ are each a hydrogen atom, and
$R_6$ and $R_7$ are each independently an alkyl group, a benzyl group, an o-methylbenzyl group, an m-methylbenzyl group, a p-methylbenzyl group, or a naphthylmethyl group.

3. The semiconductor device as claimed in claim 1, wherein:
$R_8$ to $R_{12}$ are each a hydrogen atom,
$R_{13}$ and $R_{14}$ are each independently an alkyl group, a benzyl group, an o-methylbenzyl group, an m-methylbenzyl group, a p-methylbenzyl group, or a naphthylmethyl group, and
$X_1$ is an alkyl sulfuric acid.

4. The semiconductor device as claimed in claim 1, wherein the hydrogenated epoxy resin includes:
a hydrogenated bisphenol A epoxy monomer represented by Formula 3, below, or
a hydrogenated bisphenol A epoxy oligomer represented by Formula 4, below,

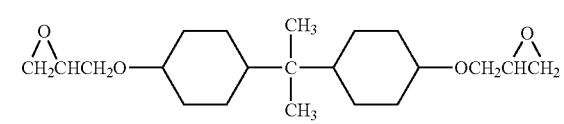

[Formula 3]

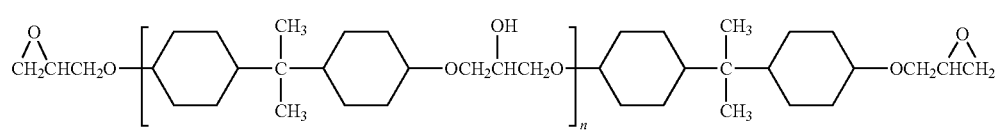

[Formula 4]

wherein, in Formula 4, n ranges from 0.1 to 13.

5. The semiconductor device as claimed in claim 1, wherein the anisotropic conductive film has an initial elastic modulus $M_0$ of 100 kgf/cm$^2$ to 1,200 kgf/cm$^2$.

6. The semiconductor device as claimed in claim 1, wherein the semiconductor device includes:
a first connection member having a first electrode,
a second connection member having a second electrode, and the anisotropic conductive film between the first connection member and second connection member to connect the first and second electrodes.

7. The semiconductor device as claimed in claim 6, wherein:
one of the first connection member and second connection member includes an IC chip or a driver IC chip, and
the other of the first connection member and second connection member includes a glass substrate.

* * * * *